United States Patent [19]
Brasen et al.

[11] Patent Number: 5,221,413
[45] Date of Patent: Jun. 22, 1993

[54] METHOD FOR MAKING LOW DEFECT DENSITY SEMICONDUCTOR HETEROSTRUCTURE AND DEVICES MADE THEREBY

[75] Inventors: Daniel Brasen, Lake Hiawatha; Eugene A. Fitzgerald, Jr., Bridgewater; Martin L. Green, New Providence; Ya-Hong Xie, Flemington, all of N.J.

[73] Assignee: AT&T Bell Laboratories, Murray Hill, N.J.

[21] Appl. No.: 690,429

[22] Filed: Apr. 24, 1991

[51] Int. Cl.$^5$ .............................................. C30B 25/02
[52] U.S. Cl. ................................. 156/613; 156/610; 156/611; 156/614; 156/DIG. 67; 437/128; 437/969; 437/976
[58] Field of Search ............... 156/610, 611, 613, 614, 156/DIG. 67; 437/128, 969, 976; 148/DIG. 59, DIG. 67, DIG. 72

[56] References Cited

U.S. PATENT DOCUMENTS

| | | | |
|---|---|---|---|
| 3,615,855 | 10/1971 | Smith | 148/DIG. 67 |
| 3,935,040 | 1/1976 | Mason | 437/128 |
| 4,357,183 | 11/1982 | Fan et al. | 437/969 |
| 4,529,455 | 7/1985 | Bean et al. | 156/DIG. 67 |
| 4,711,857 | 12/1987 | Cheng | 437/969 |
| 4,857,270 | 8/1989 | Maruya et al. | 148/DIG. 59 |
| 4,876,210 | 10/1989 | Barnett et al. | 148/DIG. 59 |

OTHER PUBLICATIONS

Kasper et al., "Acme Dimensional SiGe Superlattice Grown by UHV Epitaxy", Applied Physics 8,199, 1975 pp. 199-205.
J. M. Baribeau, et al "Growth and characterization of $Si_{1-x}Ge_x$ and Ge epilayers on (100) Si", *Journal of Applied Physics*, vol. 63, pp. 5738-5746, (1988).

*Primary Examiner*—Robert Kunemund
*Attorney, Agent, or Firm*—Glen E. Books

[57] ABSTRACT

The present invention is predicated upon the discovery by applicants that by growing germanium-silicon alloy at high temperatures in excess of about 850° C. and increasing the germanium content at a gradient of less than about 25% per micrometer, one can grow on silicon large area heterostructures of graded $Ge_xSi_{1-x}$ alloy having a low level of threading dislocation defects. With low concentrations of germanium $0.10 \leq X \leq 0.50$), the heterolayer can be used as a substrate for growing strained layer silicon devices such as MODFETS. With high concentrations of Ge $(0.65 \leq X \leq 1.00)$ the heterolayer can be used on silicon substrates as a buffer layer for indium gallium phosphide devices such as light emitting diodes and lasers. At concentrations of pure germanium (X=1.00), the heterolayer can be used for GaAs or GaAs/AlGaAs devices.

10 Claims, 3 Drawing Sheets

METHOD FOR MAKING LOW DEFECT DENSITY SEMICONDUCTOR HETEROSTRUCTURE AND DEVICES MADE THEREBY

FIELD OF THE INVENTION

This invention relates to a method for making a semiconductor heterostructure of germanium-silicon alloy that has low threading dislocation density in the alloy layer and to devices made thereby. Such low defect structures are particularly useful as buffer layers for making semiconductor devices comprising indium gallium phosphide, gallium arsenide or strained layers of silicon.

BACKGROUND OF THE INVENTION

There is considerable interest in heterostructure devices involving greater epitaxial layer thickness and greater lattice misfit than present technology will allow. For example, it has long been recognized that germanium-silicon alloy $Ge_xSi_{1-x}$ grown on silicon substrates would permit a variety of optoelectronic devices, such as LEDs, marrying the electronic processing technology of silicon VLSI circuits with the optical component technology available in direct band semiconductors. Indeed, it has been proposed that an intermediate epitaxial layer of germanium-silicon alloy would permit the epitaxial deposition of gallium arsenide overlying a silicon substrate and thus permit a variety of new optoelectronic devices using silicon electronic components and gallium arsenide optical components. However, despite the widely recognized potential advantages of such combined structures and despite substantial efforts to develop them, their practical utility has been limited by high defect densities in heterostructure layers grown on silicon substrates.

Dislocation defects partition an otherwise monolithic crystal structure and introduce unwanted and abrupt changes in electrical and optical properties. Dislocation defects arise in efforts to epitaxially grow one kind of crystalline material on a substrate of a different kind of material due to different crystal lattice sizes of the two materials. Dislocations from at the mismatched interface to relieve the misfit strain. Many of the misfit dislocations have vertical components, termed threading segments, which extend at a slant angle through any subsequent layers. Such threading defects in the active regions of semiconductor devices seriously degrade device performance.

A variety of approaches have been used to reduce dislocations with varying degrees of success. One approach is to limit the heterolayer to a thin layer of material that has a lattice crystal structure closely matching the substrate. Typically the lattice mismatch is within 1% and thickness of the layer is kept below a critical thickness for defect formation. In such structures, the substrate acts as a template for growth of the heterolayer which elastically conforms to the substrate temperature. While this approach eliminates dislocations in a number of structures, there are relatively few near lattice-matched systems with large energy band offers. Thus with this approach the design options for new devices are limited.

A second approach set forth in the copending application of E. A. Fitzgerald, Ser. No. 07/561,774 filed Aug. 2, 1990 new U.S. Pat. No. 5,158,907 utilizers heterolayers of greater thickness but limited lateral area. By making the thickness sufficiently large as compared with the lateral dimension, threading dislocations are permitted to exit the sides of layer. The upper surface is thus left substantially free of defects. This approach permits the fabrication of a variety of devices and circuits which can be made on limited area surfaces having an area of less than about 10,000 square micrometers.

A third approach is to deposit successive layers of germanium-silicon alloy on a silicon substrate, increasing the germanium content with each successive layer. The goal is to avoid dislocations by spreading the strain among successive layers. Unfortunately this approach has not worked. For example, it has been found that step grading 20% Ge over 2000 angstroms to produce pure Ge results in substantially the same high dislocation density as depositing pure Ge on Si. See J. M. Baribeau et al., 63 *Journal of Applied Physics* 5738 (1988). Applicants believe that this approach fails because at conventional growth temperatures—typically about 550° C.—the initial layer of Si—Ge is almost entirely elastically strained. Thus when the next layer of Si—Ge with greater germanium content is applied, the mismatch between the two Si—Ge layers is nearly that between the initial Si—Ge layer and the Si substrate, resulting in high dislocation density. Accordingly, there is a need for a method of making large area, low defect heterostructures on silicon.

SUMMARY OF THE INVENTION

The present invention is predicated upon the discovery by applicants that by growing germanium-silicon alloy at high temperatures in excess of about 850° C. and increasing the germanium content at a gradient of less than about 25% per micrometer, one can grow on silicon large area heterostructures of graded $Ge_xSi_{1-x}$ alloy having a low level of threading dislocation defects. With low concentrations of germanium $0.10 \leq X \leq 0.50$), the heterolayer can be used as a substrate for growing strained layer silicon devices such as MODFETS. With high concentrations of Ge $(0.65 \leq x \leq 1.00)$ the heterolayer can be used on silicon substrates as a buffer layer for indium gallium phosphide devices such as light emitting diodes and lasers. At concentrations of pure germanium (X=1.00), the heterolayer can be used for GaAs or GaAs/AlGaAs devices.

BRIEF DESCRIPTION OF THE DRAWING

The advantages, nature and various additional features of the invention will appear more fully upon consideration of the illustrative embodiments now to be described in detail. In the drawings.

It is to be understood that these drawings are for purposes of illustrating the concepts of the invention and are not to scale.

DETAILED DESCRIPTION

Figure 1:
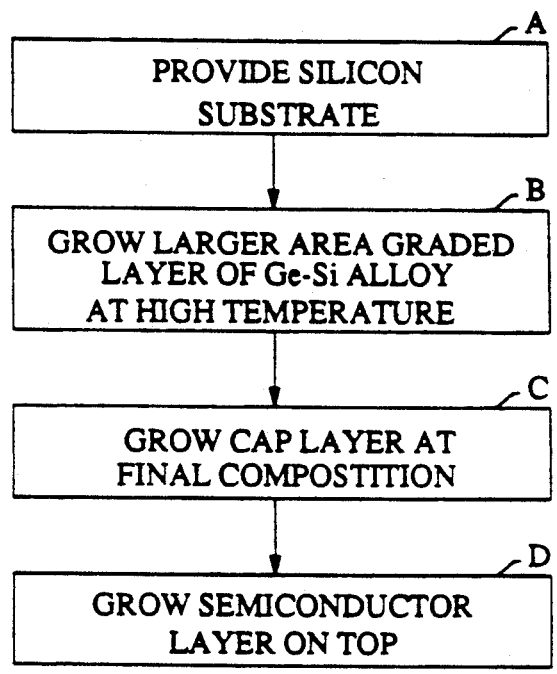
FIG. 1 is a block diagram illustrating the method of making a low defect density semiconductor heterostructure in accordance with the invention.

Referring to the drawings. FIG. 1 is a flow diagram illustrating the process for making a low defect density semiconductor heterostructure in accordance with the invention. As shown, the first step is providing a silicon substrate. Preferably the substrate is a standard (100) oriented silicon wafer of the type typically used in the fabrication of integrated circuits. Advantageously, as a preliminary step, the substrate is provided with one or more large area recessed tubs by conventional photolithographic patterning and etching. The tubes can have an area in excess of 12,000 square micrometers and a depth of several micrometers, depending upon the thickness of germanium-silicon alloy to be grown. The objective is to provide a type of proper depth so that a germanium-silicon alloy layer grown in the tub will be substantially coplanar with the non-recessed portion of the silicon substrate.

The second step of the process is to grow at high temperature on the silicon substrate a large area, graded layer of germanium-silicon alloy, $Ge_xSi_{1-x}$. The growth process is preferably chemical vapor deposition (CVD) or molecular beam epitaxy (MBE). The substrate growth starting temperature should be in the range 850° C.–1100° C., and the area of the graded alloy can exceed 12,000 square micrometers. The starting composition is preferably pure silicon. Germanium is introduced to form $Ge_xSi_{1-x}$ at a gradient of less than about 25% per micron. Preferably the grading is linear at a rate of about 10% per micron. Alternatively the grading can be stepwise at similar gradients. As the germanium content of the alloy increases, the growth temperature is advantageously scaled down in proportion to the reduced melting temperature of the alloy. The objective is to avoid melting the alloy. Graded growth of $Ge_xSi_{1-x}$ is continued until a desired final composition is reached.

The choice of final composition depends upon the intended use of the heterostructure. If, for example, the structure is to be used as a substrate for growing a strained layer silicon device, the final Ge concentration should fall within the range of 10–50%. If the structure is to be used as a substrate for an indium gallium phosphide device, the final Ge concentration should fall within the range of 65–100%. On the other hand, if the structure is to be used as a substrate for GaAs or GaAs-/AlGaAs devices, the Ge concentration is preferably about 100%.

After the desired final composition is reached, an optional cap layer with the same final composition can be grown on the graded layer to a thickness in excess of 100 angstroms and preferably in excess of one micrometer. The effect of the cap layer is to further relax the low level of residual strain at the top of the graded layer.

The fabrication and structure of the invention can be understood in greater detail by consideration of the following specific examples.

EXAMPLE 1

Heterostructure Substrate (MBE)

A (100) oriented silicon substrate is provided with a large area rectangular tube approximately ten micrometers deep by covering the major surface with a masking layer of silicon oxide, etching a rectangular opening in the oxide mask to define the periphery of the tube, and then etching the exposed silicon with ethylene-diamine-pyrocatechol (EDP). The EDP etch produces smooth tube surfaces with sidewalls in the (111) planes of the silicon substrate. The substrate is then cleaned with a 3:1 mixture of $H_2SO_4$ and $H_2O_2$ for ten minutes and with buffered HF for 1 minutes.

The cleaned substrate is placed in a Riber EVA 32 Silicon MBE Apparatus controlled by a Sentinel 3 Deposition Rate Controller. The chamber is evacuated to a pressure of less than $10^{-9}$ Torr, and any oxide on the tube surfaces is dissociated by heating the substrate to about 800° C. and applying a low flux silicon beam at a rate of about 0.05 angstrom/s. Silicon growth at higher rate is continued to a thickness of about 0.1 micrometer to form a silicon buffer layer.

After formation of the buffer layer, the substrate temperature is increased to about 900° C. and the graded is grown. Graded growth is begun with pure silicon at a rate of about 3 angstroms per second. The total growth rate is kept constant while introducing germanium at a linear gradient of about 10% per micrometer. The objective is to keep growth near thermal equilibrium. The parameter variations for graded growth to 100% germanium at 10% per micrometer grading are set forth in the Table 1, giving thickness, percent of Germanium, temperature and current rates at various times into growth.

TABLE 1

| | PARAMETER VARIATIONS FOR 10%/micron GRADING | | | | | |
|---|---|---|---|---|---|---|
| | Starting Rates (Sentinel): Si/Ge = 67.8/0.5 | | | | | |
| time into growth (min) | t(μ) | Ge % | liquidus (C/K) | % T | T substrate (C.) | Current Rates (Sentinel): Si/Ge |
| 0 | 0 | 0 | 1414/1687 | 100 | 900 | 67.8/0.5 |
| 27 | 0.486 | 5 | 1402/1675 | 99.3 | 892 | 64.4/3.5 |
| 54 | 0.972 | 10 | 1390/1663 | 98.6 | 884 | 61.0/6.7 |
| 81 | 1.458 | 15 | 1375/1648 | 97.7 | 873 | 57.6/10.5 |
| 108 | 1.944 | 20 | 1362/1635 | 96.9 | 864 | 54.2/14.0 |
| 135 | 2.430 | 25 | 1350/1623 | 96.2 | 855 | 50.9/17.5 |
| 162 | 2.916 | 30 | 1335/1608 | 95.3 | 845 | 47.5/21.0 |
| 189 | 3.402 | 35 | 1320/1593 | 94.4 | 834 | 44.1/24.5 |
| 216 | 3.888 | 40 | 1305/1578 | 93.5 | 824 | 40.7/28.0 |
| 243 | 4.374 | 45 | 1290/1563 | 92.6 | 813 | 37.3/31.5 |
| 270 | 4.860 | 50 | 1270/1543 | 91.5 | 800 | 33.9/34.9 |
| 297 | 5.346 | 55 | 1255/1528 | 90.6 | 790 | 30.5/38.4 |
| 324 | 5.832 | 60 | 1235/1508 | 89.4 | 776 | 27.1/41.9 |
| 351 | 6.318 | 65 | 1210/1483 | 87.9 | 758 | 23.7/45.4 |
| 378 | 6.804 | 70 | 1185/1458 | 86.4 | 740 | 20.3/48.9 |
| 405 | 7.290 | 75 | 1160/1433 | 84.9 | 722 | 17.0/52.4 |
| 432 | 7.776 | 80 | 1130/1403 | 83.2 | 703 | 13.6/55.9 |
| 459 | 8.262 | 85 | 1100/1373 | 81.4 | 681 | 10.2/59.4 |
| 486 | 8.748 | 90 | 1055/1328 | 78.7 | 650 | 6.8/62.9 |
| 513 | 9.234 | 95 | 1010/1283 | 76.0 | 618 | 3.4/66.4 |

TABLE 1-continued

| PARAMETER VARIATIONS FOR 10%/micron GRADING Starting Rates (Sentinel): Si/Ge = 67.8/0.5 | | | | | | |
|---|---|---|---|---|---|---|
| time into growth (min) | t(μ) | Ge % | liquidus (C/K) | % T | T substrate (C.) | Current Rates (Sentinel): Si/Ge |
| 540 | 9.720 | 100 | 938/1211 | 71.8 | 569 | 0.5/69.9 |

After 100% germanium is reached, a final germanium cap layer having a thickness in the range between 1000 angstroms and one micrometer is grown on top.

Structures with less than 100% germanium can be obtained by terminating graded growth at the desired germanium concentration and growing the final cap layer at the concentration.

Example 2

Heterostructure Substrate (CVD)

As preliminary steps, a 100 mm (100) Si wafer was cleaned in dilute HF (1% in $H_2O$) and spin-dried in $N_2$. The wafer was loaded into an RTCVD reactor and pumped down to a base pressure of $10^{-7}$ Torr. The wafer was heated to 1000° C. or 15 seconds in flowing $H_2$ (3 lpm) to remove residual oxygen and carbon, and then cooled in 2 seconds to 900° C.

After these preliminary steps, deposition was commenced by depositing a Si buffer layer approximately 1000 Å thick. This was accomplished using $SiH_2Cl_2$ (1% in $H_2$, 1 lpm) for 1 minute at a pressure of about 4 Torr. Immediately thereafter, $GeH_4$(1%$GeH_4$ in $H_2$) was introduced gradually to create a Si—Ge alloy layer that increased from 0 to 50% Ge. The $GeH_4$ flow can be increased by 4 sccm flow increments every 40 seconds. The $SiH_2Cl_2$ was decreased by the same flow increment in the same time scale; thus, the total $GeH_4$ and $SiH_2Cl_2$ flow was maintained at 1 lpm. Deposition at 900° C. resulted in a Si—Ge graded alloy layer that continually relaxed as it was grown.

Heterostructures fabricated as described in Examples 1 and 2 demonstrate a reduction in defects as compared with conventionally fabricated heterostructures. Triple crystal X-ray diffraction shows that for $0.10 < x < 0.50$, the layers are totally relaxed. The $Ge_xSi_{1-x}$ cap layers, when examined by plan-view and cross-sectional transmission electron microscopy are threading dislocation free. Electron beam induced current images revealed low threading dislocation densities of $4 \times 10^5 \pm 5 \times 10^4$ cm$^{-2}$ for $X=0.25$ and $3 \times 10^4 \pm 2 \times 10^6$ cm$^{-2}$ for $x=0.50$. Photoluminescence spectra from the cap layers are substantially identical to photoluminescence from bulk $Ge_xSi_{1-x}$.

These low defect heterostructures can serve as buffer layers for epitaxially growing a wide variety of devices varying from those employing strained layers of silicon to those employing III-V semiconductors.

Figure 2:
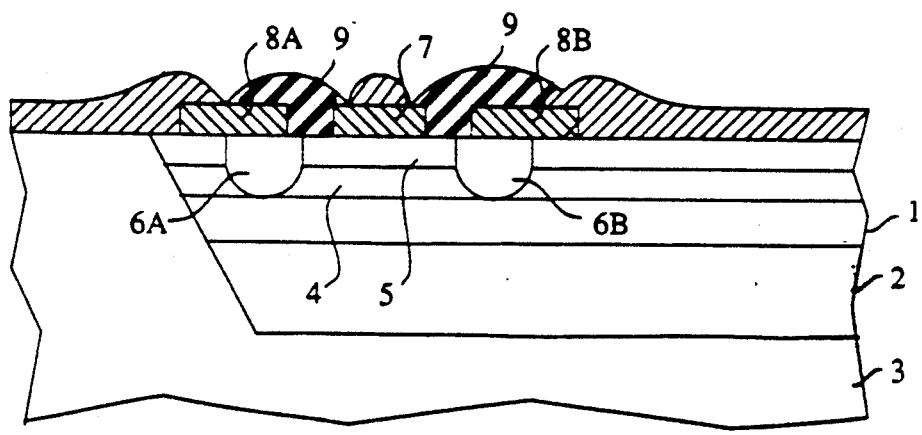
FIG. 2 is a schematic cross section of a strained silicon layer MODFET made in accordance with the invention.

FIG. 2 is a schematic cross section of a device employing a low defect heterostructure to produce a strained silicon MODFET. In essence the MODFET is fabricated on a heterostructure comprising a $Ge_xSi_{1-x}$ cap layer 1 grown on a graded layer 2, all disposed on a silicon substrate 3. The heterostructure is fabricated as described above, with a maximum concentration of germanium in the range ($0.10 \leq x \leq 0.50$) and preferably with $x=0.30$.

The MODFET fabricated on the heterolayer comprises, in essence, a strained layer of silicon 4 epitaxially grown on layer 1. Another layer 5 of $Ge_xSi_{1-x}$ (initially intrinsic but n-doped after 50 to 900 angstroms) is grown over the silicon and, n+ spaced apart contact regions 6A and 6B are formed to contact the strained silicon layer 4. Ohmic contacts 8A and 8B are made with the n+ contact regions 6A and 6B, and a Schottky barrier contact 7 to layer 5 is disposed between the spaced apart ohmic contacts. A dielectric layer 9 advantageously separates the contacts 7, 8A, and 8B.

Silicon layer 4 preferably has a thickness in the range 100 angstroms to 1000 angstroms and is preferably undoped.

$Ge_xSi_{1-x}$ layer 5 preferably has a thickness in the range 50 angstroms to 1000 angstroms. Layer 5 is preferably intrinsic for 50 to 900 angstroms and then n+ doped with antimony, phosphorus or arsenic to a concentration in the range $1 \times 10^{17}$/cm$^3$–$5 \times 10^{18}$/cm$^2$. Layer 5 preferably has a concentration of Ge not less than that of cap layer 1.

The n+ contact regions 6A and 6B are preferably formed by implanting antimony, arsenic or phosphorus to silicon layer 4 at a concentration of $10^{19}$/cm$^3$. The ohmic contacts 8A and 8B can be layers of aluminum and the Schottky contact 7 can be a layer of platinum.

The resulting MODFET acts as a field effect transistor with the advantage of higher speed. The application of a signal voltage bias to the Schottky contact 7 (commonly known as the gate) changes the electron density inside the Si layer 4, which in turn changes the sheet conductance of the channel between 8A and 8B and results in transistor action. The strained silicon layer is a particularly high speed path for at least three reasons: 1) the straining of the silicon alters the energy bands of the silicon to favor conduction by low effective mass, high mobility electrons, 2) the silicon layer is free of impurities to interfere with electron flow, and 3) the silicon layer grown on a low defect substrate has a low concentration of defects to interfere with electron flow.

Figure 3:
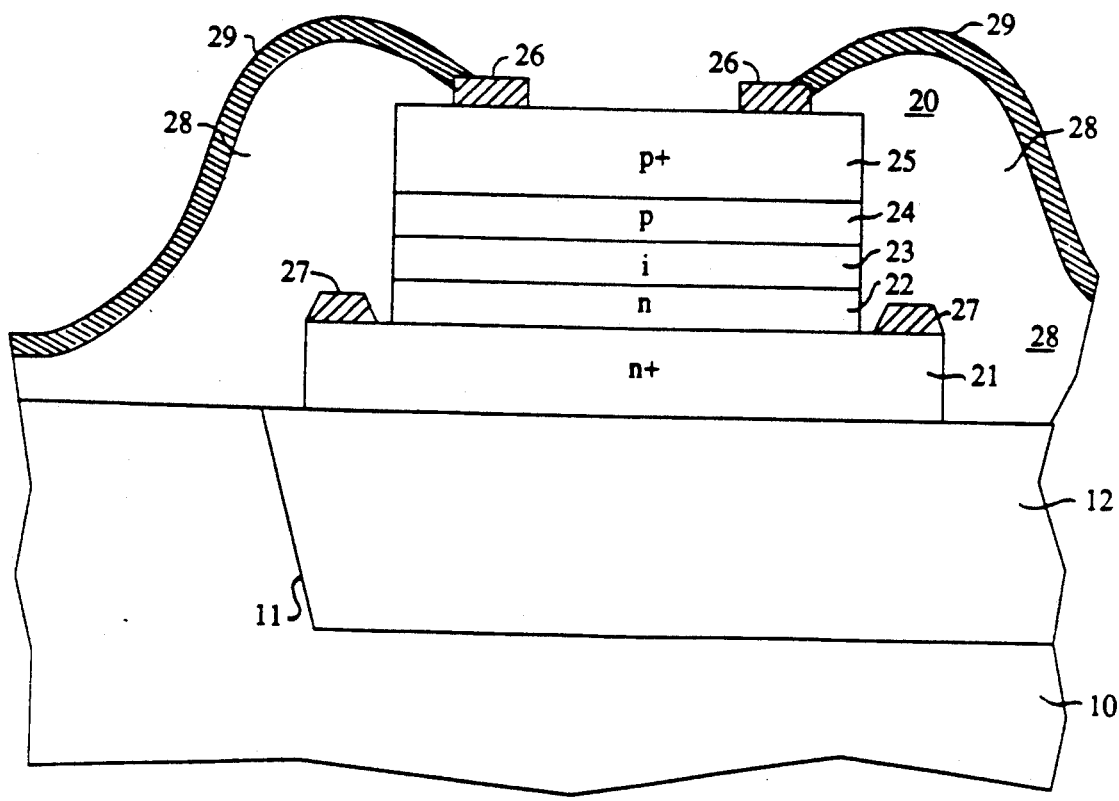
FIG. 3 is a schematic cross section of an indium gallium arsenide surface emitting LED made in accordance with the invention.

FIG. 3 is a schematic cross section of an indium gallium arsenide surface emitting LED fabricated on a heterolayer in accordance with the invention. Specifically, the LED 20 is fabricated on a heterostructure comprising a $Ge_xSi_{1-x}$ layer 12 grown within a large area tub 11 on a silicon substrate 10. The heterostructure is fabricated essentially as described above, except that the $Ge_xSi_{1-x}$ is doped with p-type impurities, such as Be, to a concentration of $10^{18}$cm$^{-3}$.

The LED 20 is fabricated on the $Ge_xSi_{1-x}$ using conventional processes such as chemical beam epitaxy to form the constituent layers 21-25 whose thicknesses, constituency and doping are set forth in table 2 below:

TABLE 2

| Layer No. | Composition | Thickness | Dopant | Concentration |
|---|---|---|---|---|
| 21 | $In_y(Ga_{1-z}Al_z)_{1-y}P$ | 1 micrometer | n+(Si) | $10^{18}$ cm$^{-3}$ |
| 22 | $In_w(Ga_{1-x}Al_x)_{1-w}P$ | 0.5 micrometer | n(Si) | $10^{17}$ cm$^{-3}$ |
| 23 | $In_u(Ga_{1-v}Al_v)_{1-u}P$ | 0.2 micrometer | none | intrinsic |
| 24 | $In_w(Ga_{1-x}Al_x)_{1-w}P$ | 0.5 micrometer | p(Be) | $10^{17}$ cm$^{-3}$ |
| 25 | $In_y(Ga_{1-z}Al_z)_{1-y}P$ | 1 micrometer | p+(Be) | $10^{18}$ cm$^{-3}$ |

After the constituent layers are grown, the next step is to form ohmic contacts and to isolate the device. Ohmic contact 26 is formed to contact p-doped layer 25 by depositing a layer of gold-zinc alloy and photolithographically patterning the metal to form a annular ring.

To isolate the diode, the portion of layers 22-25 outside the metal contact ring 26 can be etched away. Using a photoresist circle as a mask, a mesa is etched around ring 26 terminating on n-doped layer 21. Preferably etching is by reactive ion etching in order to obtain a mesa with vertical side walls around the periphery of ring 26.

Next ohmic contact 27 is made with the now exposed n-doped layer 21 as by depositing a layer of gold-germanium alloy and photolithographically defining annular contact ring 27 around the mesa. For further isolation, a mesa concentric with ring 27 can be chemically etched through layer 21.

The final steps involve depositing passivating insulating layers 28 and forming metal interconnects 29 to contacts 26 and 27 in accordance with techniques well known in the art. The interconnects can advantageously extend to integrated electronic circuitry (not shown) formed on the silicon substrate.

In operation, a DC bias voltage applied between contacts 26 and 27 induces emission of light through the center of ring 26.

A particular advantage of this embodiment is that the composition of the $Ge_xSi_{1-x}$ layer can be chosen to lattice match a variety of indium gallium phosphide compounds giving a wide choice of emission wavelengths. For example, when the indium gallium phosphide compound matches a Ge—Si buffer with 65-70% Ge, the emission is green whereas a compound lattice matched to 100% Ge emits red. Thus much of the visible range can be covered.

Figure 4:
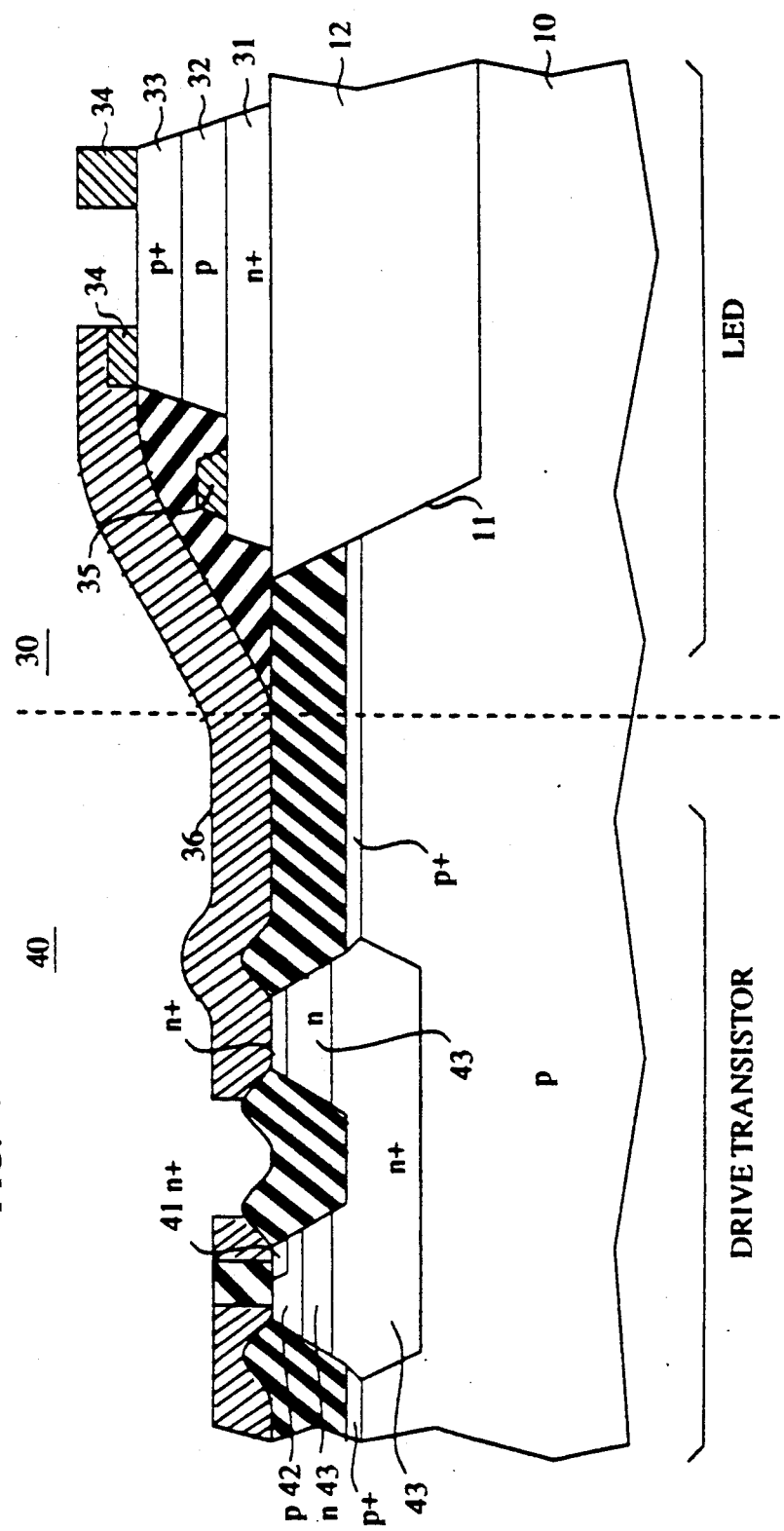
FIG. 4 is a schematic cross section of a gallium arsenide LED with integrated drive transistor made in accordance with the invention.

FIG. 4 is a schematic cross section of a GaAs surface emitting LED fabricated on a heterolayer in accordance with the invention. In particular, the LED 30 is fabricated on a heterostructure comprising a $Ge_xSi_{1-x}$ layer 12 grown within a large area tube 11 on a silicon substrate 10. In addition the LED is shown connected via a metal lead 36 to a drive transistor 40 integrally formed in silicon substrate 10.

The $Ge_xSi_{1-x}$ layer is formed in tube 11 as described in Example 1 above. The $Ge_xSi_{1-x}$ is preferably undoped and achieves a final composition consisting essentially of pure germanium in order to lattice match the materials of LED 30.

LED 30 comprises a layer of n-doped $Al_yGa_{1-y}As$ 31 grown on the Ge surface, as by MBE, a layer of p-doped GaAs 32 grown on layer 31 and a layer 33 of p+ doped $Al_yGa_{1-y}As$ grown on layer 32. The LED has an annular p-type ohmic contact 34 to layer 33 and an n-type ohmic contact 35 to layer 31.

In a specific structure, n-layer 31 can be doped with silicon to a concentration of $10^{18}/cm^3$ and have a thickness of 0.5 micrometer, p-layer 32 can be doped with Be to a concentration of $10^{16}/cm^3$ and have a thickness of 0.6 micrometer. P+ layer 32 can be doped with Be to $10^{19}/cm^3$ and have a thickness of 0.5 micrometers. The n-contact 35 can be a composite layer of nickel, titanium and gold, and the p-contact 34 can be AuBe alloy. The LED 30 can be connected to transistor 40 with aluminum interconnects 36.

Drive transistor 40 consists essentially of an n-type emitter 41, a p-type base 42 and an n-type collector 43 integrally fabricated on silicon substrate 10 in accordance with conventional techniques well known in the art.

This example illustrates the important advantage that the invention permits silicon electronic components (e.g. transistor 40) and III-V semiconductor optical components (e.g. LED 30) to be fabricated on the same substrate. Clearly, much more complex circuits can be fabricated on the structure.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

We claim:

1. A method for making a semiconductor device comprising the steps of:
   providing a monocrystalline silicon substrate;
   epitaxially growing on said silicon substrate at a temperature in excess of 850° C. a graded layer of $Ge_xSi_{1-x}$ with increasing germanium content at a gradient of less than about 25% per micrometer to a final composition in the range $0.1 \leq x \leq 1.0$; and
   epitaxially growing a layer of semiconductor material above said graded layer of $Ge_xSi_{1-x}$.

2. The method of claim 1 wherein said layer of semiconductor material comprises a cap layer of Ge—Si alloy having the same composition as the surface of the graded layer and a thickness in excess of 100 angstroms.

3. The method of claim 1 wherein said graded layer of $Ge_xSi_{1-x}$ has a final composition in the range $0.1 \leq x \leq 0.5$ and said layer of semiconductor material comprises silicon.

4. The method of claim 1 wherein said graded layer of $Ge_xSi_{1-x}$ has a final composition in the range $(0.65 \leq x \leq 1.0)$ and said layer of semiconductor material comprises indium gallium phosphide.

5. The method of claim 1 wherein said graded layer of $Ge_xSi_{1-x}$ has a final composition of pure germanium and said layer of semiconductor material comprises gallium arsenide or aluminum gallium arsenide.

6. The method of claim 1 wherein said epitaxial layers are grown by molecular beam epitaxy.

7. The method of claim 1 wherein said epitaxial layers are grown by chemical vapor deposition.

8. The method of claim 1 further comprising the step of providing said silicon substrate with a recessed to tub having a depth equal to the sum of the thickness of the graded layer of $Ge_xSi_{1-x}$ and the cap layer.

9. The method of claim 1 wherein the temperature of growth of said graded layer of $Ge_xSi_{1-x}$ is scaled in proportion to the melting temperature of the $Ge_xSi_{1-x}$.

10. The method of claim 1 wherein the area of said graded $Ge_xSi_{1-x}$ layer exceeds 12,000 square microns.

* * * * *

UNITED STATES PATENT AND TRADEMARK OFFICE
CERTIFICATE OF CORRECTION

PATENT NO. : 5,221,413

DATED : Jun. 22, 1993

INVENTOR(S) : Daniel Brasen, Eugene A. Fitzgerald, Jr., Martin L. Green, Ya-Hong Xie It is certified that error appears in the above-identified patent and that said Letters Patent is hereby corrected as shown below:

Column 8, line 54, delete "recessed to tub" should read --recessed tub--.

Signed and Sealed this

Fifteenth Day of February, 1994

*Attest:*

BRUCE LEHMAN

*Attesting Officer*     *Commissioner of Patents and Trademarks*